United States Patent [19]
Hasagawa

[11] Patent Number: 5,810,617
[45] Date of Patent: Sep. 22, 1998

[54] JUMPER CONNECTOR

[75] Inventor: Miki Hasagawa, Itami, Japan

[73] Assignee: Japan Solderless Terminal MFG Co., Ltd., Osaka, Japan

[21] Appl. No.: 820,253

[22] Filed: Mar. 18, 1997

[30] Foreign Application Priority Data

Mar. 18, 1996 [JP] Japan .................................. 8-090123
Nov. 18, 1996 [JP] Japan .................................. 8-323542

[51] Int. Cl.$^6$ .................................................. H01R 31/08
[52] U.S. Cl. ........................................................ 439/510
[58] Field of Search ............................. 439/86, 90, 507, 439/510, 512, 149, 509

[56] References Cited

U.S. PATENT DOCUMENTS 4,883,430  11/1989  Siemon et al. ........................ 439/510
5,169,337  12/1992  Ortega et al. ......................... 439/510
5,711,681   1/1998  Hasegawa ............................. 439/86

Primary Examiner—Hien Vu
Assistant Examiner—Yong Ki Kim
Attorney, Agent, or Firm—Antonelli, Terry, Stout & Kraus, LLP

[57] ABSTRACT

A jumper connector (15) for making an electric connection between contact pins or posts (14) that protrude from a printed circuit board (11) has a recipient core (16) made of a conductive elastomer. The jumper connector further has parallel bores (17) formed through the recipient core so as tightly fit on the two contact pins (15). An insulating mantle (18) is integrally secured to and covers the outer periphery of the recipient core. One or two finger tabs (19) extend in the longitudinal direction of the insulating mantle (18), and a guide (30) is formed in or on the bottom of the recipient core so that the contacts pins (14) are guided to take a correct position relative to the parallel bores (17) of the jumper connector, which enables a high density array of contact pins, is easily mountable on and dismountable from a printed circuit board and is of such a simple structure as reducing manufacture cost.

6 Claims, 9 Drawing Sheets

JUMPER CONNECTOR

FIELD OF THE INVENTION

The present invention relates to a jumper connector adapted for use to electrically connect male contacts or terminals one to another, wherein the contacts or terminals are present on a printed circuit board or the like.

DESCRIPTION OF PRIOR ART

FIG. 15 shows a typical example of prior art jumper connectors in use with a pin header 2. The pin header mounted on a printed circuit board 1 has an array of contact pins or posts 3. The jumper connector 4 electrically connects any one of those pins to the other neighboring pin. Two sockets 6 fittable on those pins 3 are united together by a conductive piece 7 to form a socket contact 5 secured in an insulating housing 8. Thus, the two pins 3 will communicate with each other through such a socket contact 5.

The prior art jumper connectors 4 are however somewhat disadvantageous in that their socket contacts 5 are complicated in structure and expensive to manufacture. They also occupy a considerably large space on a circuit board, thereby failing to match a high density arrangement of contact pins or posts.

SUMMARY OF THE INVENTION

An object of the present invention is therefore to provide a jumper connector free from the problems mentioned above. Another object is to provide a jumper connector whose core part is made of a conductive elastomer, and simple in structure. The jumper connector proposed herein should be inexpensive, adapted for high density arrays of contact pins and also capable of being easily and readily attached to and detached from the contact pins.

A jumper connector provided herein for making an electric connection between male contacts that protrude from a printed circuit board, does comprise: a recipient core made of a conductive elastomer; parallel bores formed through the recipient core so as tightly fit on the male contacts; an insulating mantle integrally secured to and covering an outer peripheral surface of the recipient core; and at least one finger tab extending longitudinally of the insulating mantle. The finger tab may desirably be integral with the insulating mantle.

Preferably, the jumper connector may also comprise a guide means formed in or on the bottom of the recipient core. The guide means is constructed such as to help the male contacts take quickly a correct position aligned with the parallel bores. In one case, the guide means consists of a first groove and second grooves each intersecting the former. The first groove extends straight across the bottom openings of the core's parallel bores. Each second groove extends across one of said bottom openings. In another case, the guide means consists of at least one boss protruding downward from the recipient core bottom. Each boss is located adjacent to the bottom openings of two neighboring parallel bores.

The conductive elastomer forming the recipient core contains a controlled amount of a conductive filler dispersed in an elastomeric matrix. This amount is to be adjusted to meet an electric resistance of any level required for the core. The filler may preferably be carbon black or a conductive powder of copper, nickel, silver or the like.

THE PREFERRED EMBODIMENTS

Figure 1:
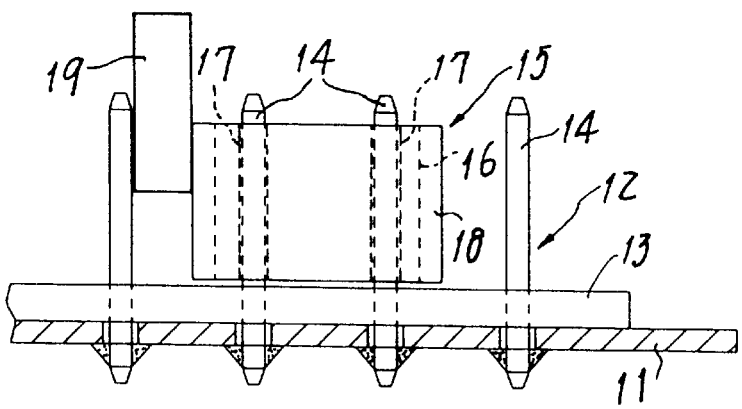
FIG. 1 is a front elevation of a jumper connector shown in use and provided in an embodiment.

Some embodiments of the present invention will now be described referring to the drawings.

Figure 2:
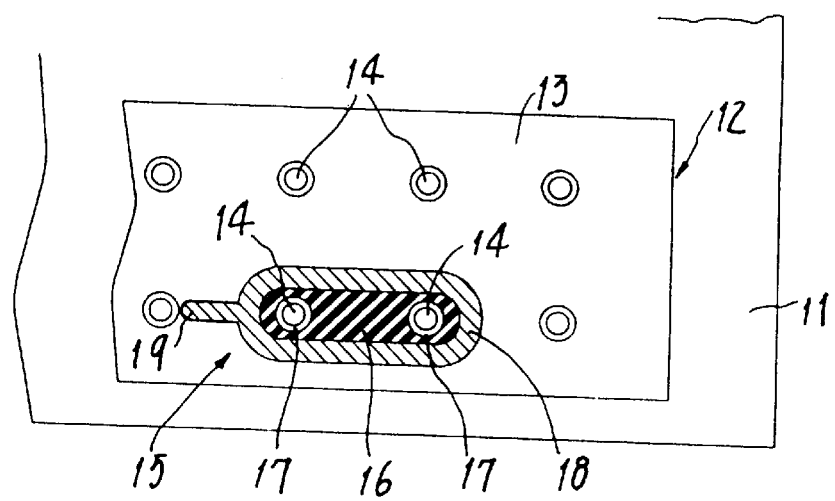
FIG. 2 is an enlarged plan view of the jumper connector shown in FIG. 1.
Figure 3:
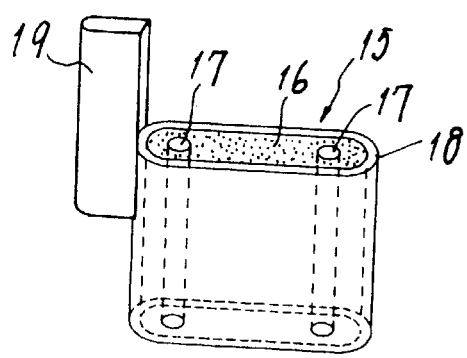
FIG. 3 is a perspective view of the jumper connector shown in FIG. 1.

In an embodiment illustrated in FIGS. 1 to 3, a jumper connector is designed for use with a pin header 12. The pin header is surface-mounted on a printed circuit board 11, and has a base housing 13 through which a plurality of upright contact pins or posts 14 (as the male contacts referred to above) protrude upwards in the drawings.

The jumper connector 15 comprises a recipient core 16 that is a short column of an elliptic shape in cross section and made of a conductive elastomer. A pair of parallel bores 17 are formed through the core 16 to open at opposite ends thereof. Two contact pins or posts 14 will fit in the bores 17 for making a 'jumper connection'. An insulating mantle 18 made of a non-conductive elastomer covers the whole outer periphery of the recipient core 16. A finger tab 19 formed integral with the mantle 18 protrudes outwardly therefrom (and upwards in the drawings). The diameter of each parallel bore 17 is designed smaller than that of each contact pin 14 by about 20% so that they can be brought into a close and forced contact with each other.

The conductive elastomer forming the recipient core 16 may preferably be a silicone rubber containing a controlled amount of carbon black dispersed therein as the conductive filler. Alternatively, a copper powder, nickel powder, silver powder or the like may be used in place of carbon black. The amount of such a filler can easily be adjusted to meet a required electric resistance of the recipient core 16. From a viewpoint of affinity between the mating materials, the insulating mantle 18 is made of a certain nonconductive elastomer or rubber, as noted above. This elastomer not containing any conductive filler but miscible with the core material may be the same silicone rubber as that which forms the core. It is also possible to use as the mantle an appropriate hard cover that may be formed of Nylon (a registered trademark) or the like insulating plastics.

Figure 4:
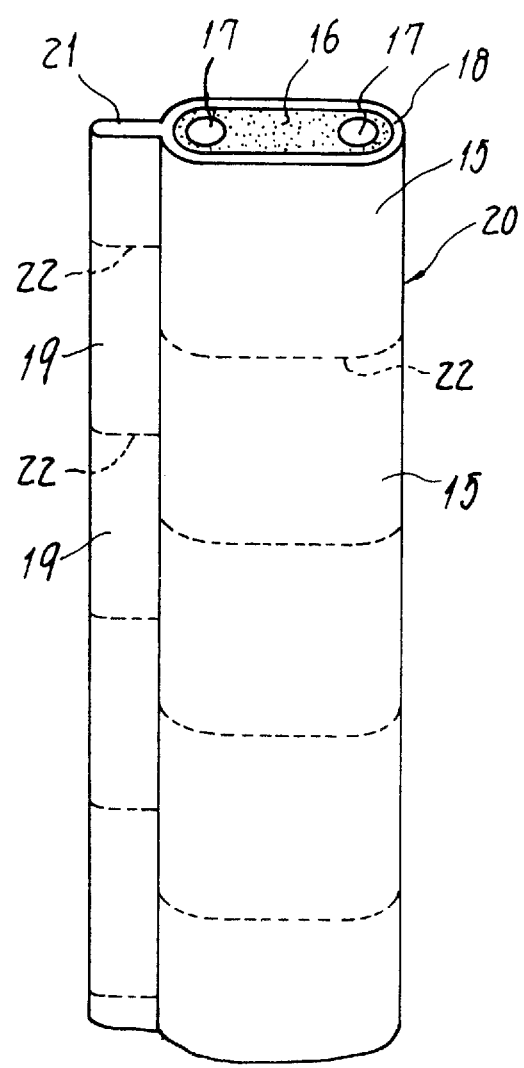
FIG. 4 is a perspective view of an elongate continuous body from which a plurality of the jumper connectors are to be severed during manufacture thereof.

In manufacture of the jumper connector, materials forming its core 16 and mantle 18 may be extruded simultaneously and in harmony through a common duplex die to give a continuous body of a double-part structure (viz. 'skin-core' structure) as shown in FIG. 4. Extending through this body 20 are a series of the conductive rubber recipient cores 16. Those cores each having parallel bores 17 to tightly fit on contact pins 14 (as the male contacts) are integral with each other at their facing ends. Such a series of the cores 16 is enclosed with a continuous cylindrical layer of a nonconductive rubber. This cylindrical layer is likewise a series of insulating mantles 18 that are also integral with each other at their facing ends to cover the respective cores. As the continuous body 20 is extruded, a longitudinal lug 21 of a ridge-like shape is formed along and integral with one of lateral sides of the continuous body. Thus, the finger tabs 19 are provided for the respective jumper connectors at the time when said body 20 will subsequently be severed into lengths at the broken lines in FIG. 4, thus enabling an inexpensive mass production of the jumper connectors.

Figure 5A:
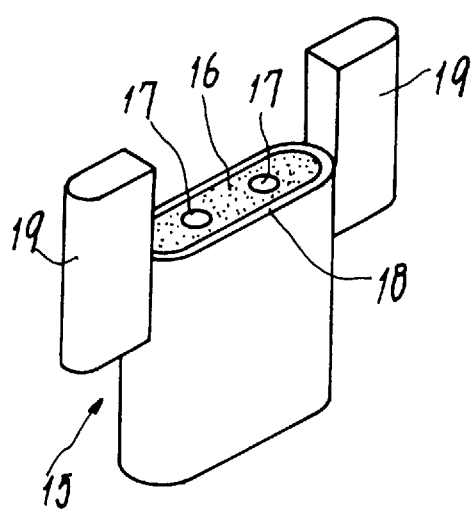
FIGS. 5a to 5d are perspective views of modified examples of the jumper connector shown in FIG. 3.
Figure 5B:
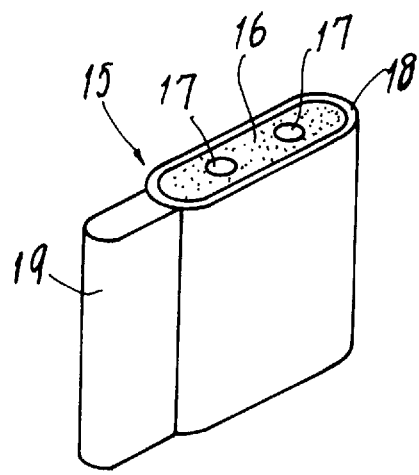
Figure 5C:
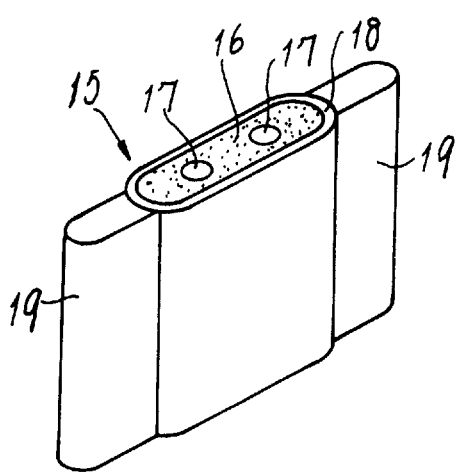
Figure 5D:
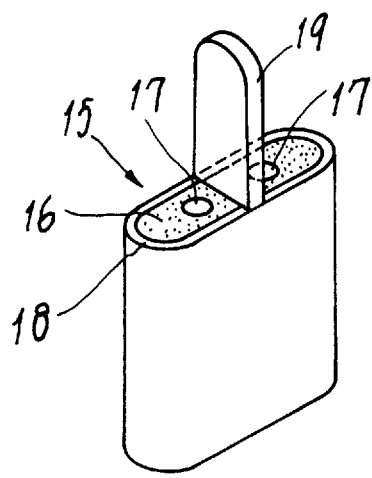

FIGS. 5a to 5d illustrate four modifications that are available in the described embodiment with regard to the finger tab 19. In one example shown in FIG. 5a, two finger tabs are integral with the opposite lateral sides of the insulating mantle 18 and protrude from one end thereof. In another example in FIG. 5b, one finger tab 19 extends along one side of the mantle and over the full length thereof. FIG. 5c shows still another example wherein a pair of two tabs 19 each being the same as that shown in FIG. 5b are formed along both sides of the mantle. FIG. 5d shows a further example wherein one tab 19 protrudes from the middle portion of the mantle end.

The jumper connector 15 will be mounted on a circuit board by a user or operator so as to take a position as seen in FIGS. 1 and 2. In detail, he or she will pick up the connector by gripping the finger tab 19 with his or her fingers and then press the connector towards the two contact pins 14. Thus, those pins are forced into the respective bores 17 of the recipient core 16. By virtue of the core's elasticity, those pins electrically connected to each other in this manner will be held in tight contact with the inner peripheries of the bores 17. A 'jumper connection' thus produced between the two pins 14 will have a predetermined electric resistance. This resistance inherent in said core 16 is freely adjustable by varying the amount of conductive filler such as carbon black dispersed in the elastomer, as noted above. The jumper connector 15 can be removed from the two contact pins 14 if and when so desired. To that end, the user or operator may catch the finger tab 19 again and pull the connector away from the pins.

FIGS. 6 to 14 illustrates a jumper connector provided in modified embodiments of the present invention, wherein the connector 15 has a guide means 30 formed in or on the bottom of the recipient core 16. The guide means 30 is constructed such as to help the contacts pins or posts 14 take quickly a correct position aligned with the parallel bores 17.

Figure 6:
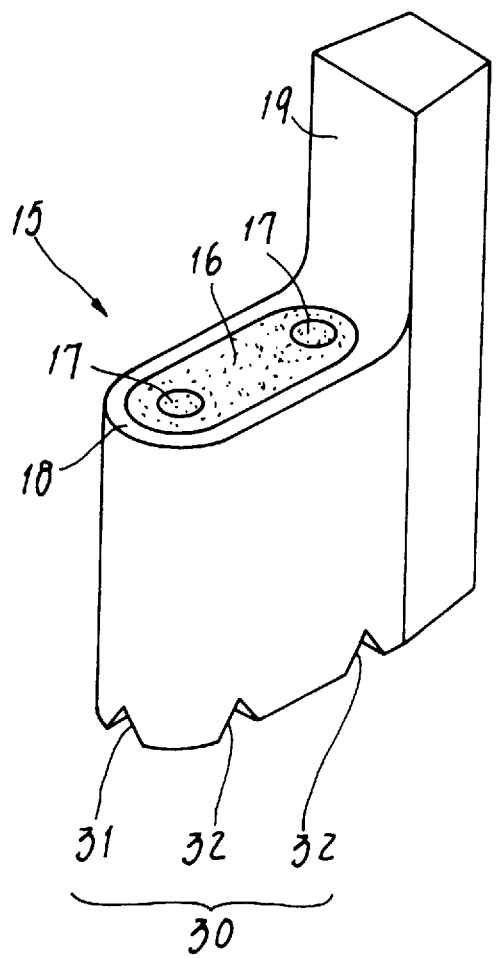
FIG. 6 is a perspective view of a jumper connector provided in a modified embodiment.
Figure 7:
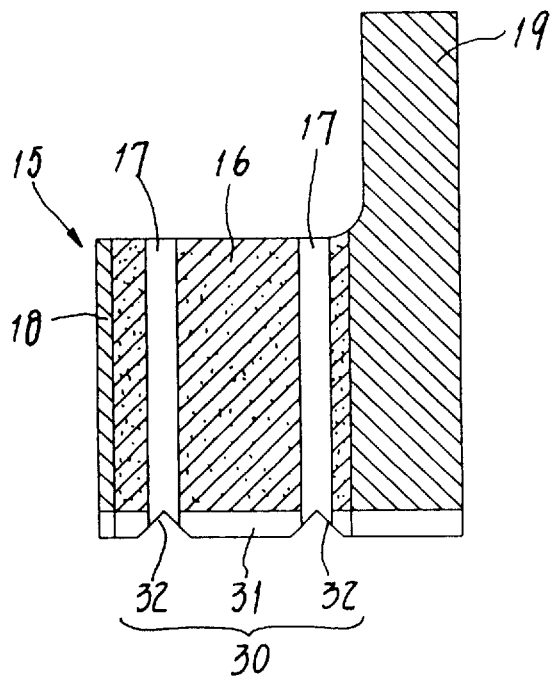
FIG. 7 is a vertical cross section of the jumper connector shown in FIG. 6.
Figure 8:
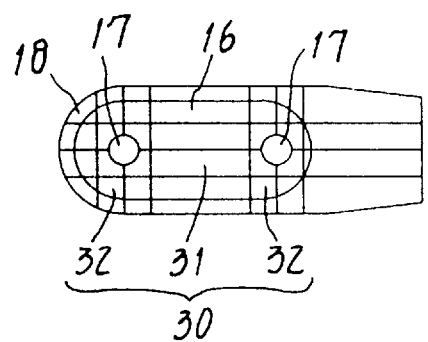
FIG. 8 is a bottom plan view of the jumper connector shown in FIG. 6.

In the embodiment shown in FIGS. 6 to 8, the guide means 30 consists of a first groove 31 and second grooves 32 each intersecting the former, with the latter two being arranged in parallel with each other. As best seen in FIG. 8, the first groove 31 extends straight across the row of bottom openings of the core's parallel bores 17. Each second groove 32 extends across one of said bottom openings. All the grooves 31 and 32 are substantially V-shaped in cross section, though they may be U-shaped in a modification not shown.

Figure 9:
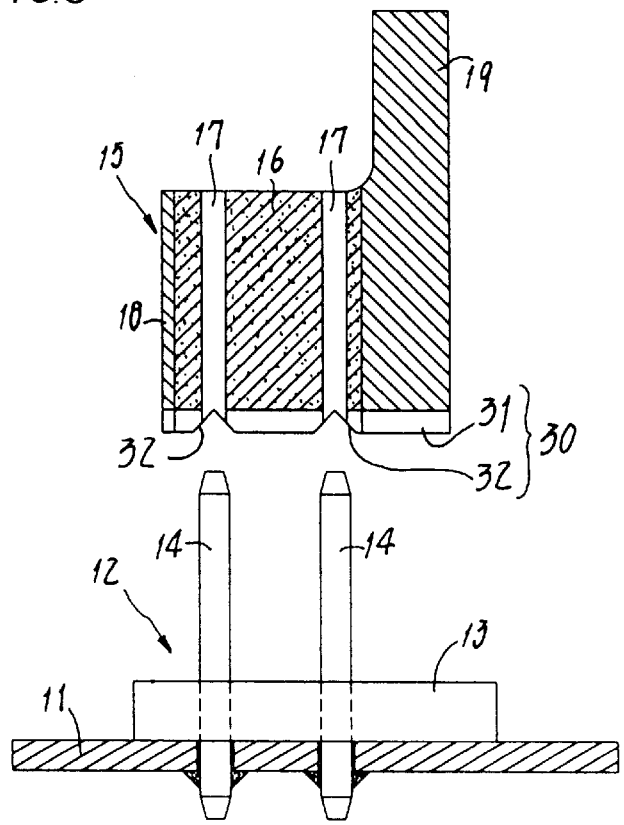
FIG. 9 is a vertical cross section corresponding to FIG. 7 but showing the connector in a state ready for connection with contact pins.
Figure 10:
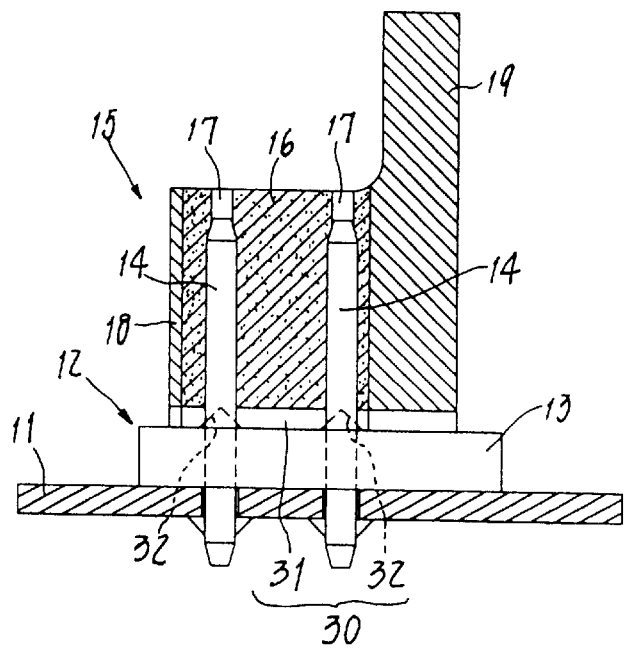
FIG. 10 is also a vertical cross section of the jumper connector that is shown in FIG. 9 and has been set in place.
Figure 11:
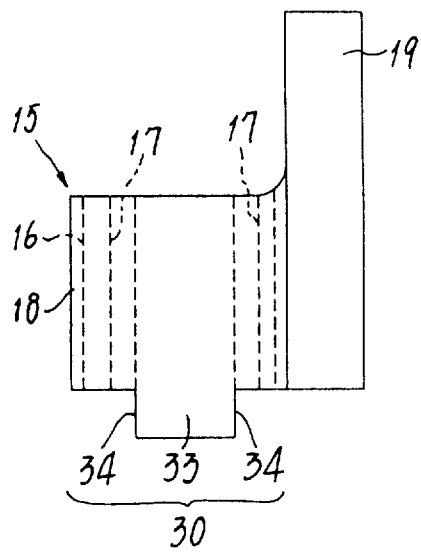
FIG. 11 is a front elevation of a jumper connector provided in a further modified embodiment.
Figure 12:
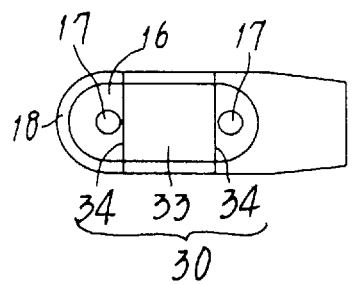
FIG. 12 is a bottom plan view of the jumper connector shown in FIG. 11.
Figure 13:
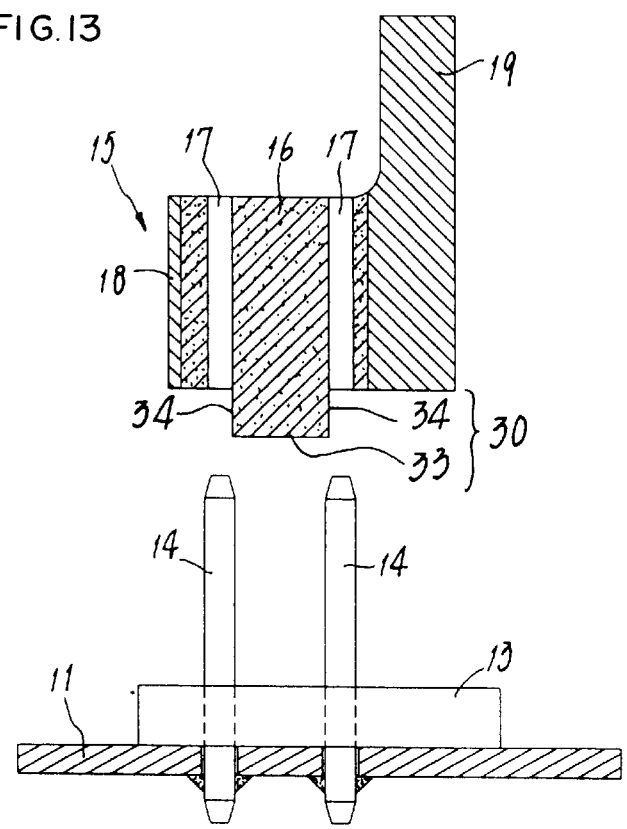
FIG. 13 is a vertical cross section corresponding to FIG. 12 but showing the connector in a state ready for connection with contact pins.
Figure 14:
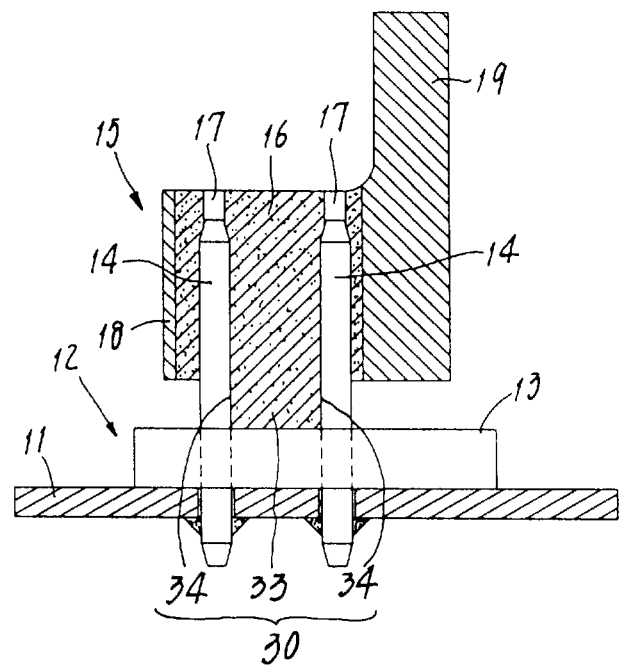
FIG. 14 is also a vertical cross section of the jumper connector that is shown in FIG. 12 and has been set in place.
Figure 15:
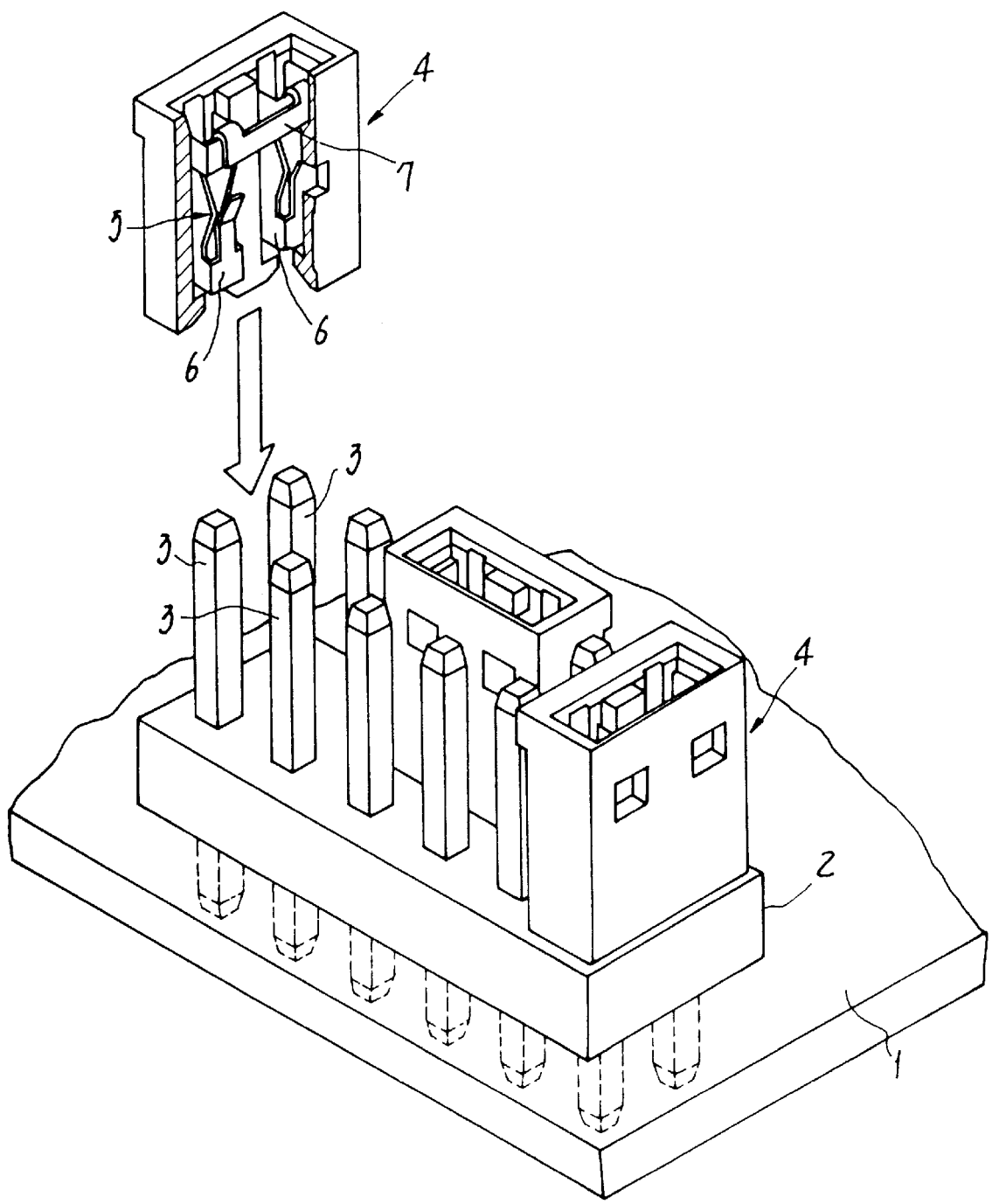
FIG. 15 is a perspective view of the prior art jumper connector shown in use.

FIGS. 9 and 10 show that the jumper connector 15 in the modified embodiment will also be used in a manner similar to the first embodiment. The user or operator will pick up the connector by gripping the finger tab 19 with his or her fingers and then press the connector towards the two contact pins 14. Thus, those pins are readily forced into the respective bores 17 of the recipient core 16 while being guided by the guide grooves 31 and 32 to take a correct position relative to said bores. By virtue of the core's elasticity, those pins electrically connected to each other in this manner will be held in tight contact with the inner peripheries of the bores 17.

In the further modified embodiment shown in FIGS. 11 to 14, the guide means 30 consists of a boss 33 integrally protruding downward from the bottom of recipient core 16. The boss is located adjacent to the openings of adjacent parallel bores 17. Both sides 34 of the boss 33 will be brought into a sliding contact with the neighboring contact pins 14 so that the bores can exactly be brought into alignment with the pins, thereby rendering easier the engagement of said pins with said bores.

In summary, the jumper connector provided herein has a recipient core that is made of a conductive elastomer and has two or more parallel bores adapted to tightly and forcibly fit on the respective male contacts. Since the recipient core is simply covered with a nonconductive mantle, the present connector is of a concise structure and can be manufactured at a lower cost. This jumper connector is particularly adapted for high density arrays of contact pins or posts. Since any designer of the connector of the invention can freely select the amount of a filler dispersed in the conductive elastomer, it is easy for him or her to adjust to any desired level the electric resistance of jumper connection made between the male contacts. Due to the elastic and tight engagement of the core with the contacts, the jumper connection is of improved anti-shock and water-proof properties.

Such a tight engagement will inevitably and considerably render the recipient core more resistant to the friction that will be imparted to it when it is removed from the male contacts. However, the finger tab or tabs formed integral with the connector will help the user or operator remove the connector easily from those contacts.

Further, the guide means formed on or in the recipient core bottom will ensure an easier and correct positioning of those male contacts relative to the parallel bores in the core.

What is claimed is:

1. A jumper connector for making an electric connection between male contacts that protrude from a printed circuit board, the jumper connector comprising:
   a recipient core made of a conductive elastomer;
   parallel bores formed through the recipient core so as to be tightly fitted on the male contacts;
   an insulating mantle integrally secured to and covering an outer peripheral surface of the recipient core; and
   at least one finger tab extending longitudinally from the insulating mantle and usable for pressing the connector towards the male contacts or pulling the connector away from the male contacts.

2. A jumper connector as defined in claim 1, wherein the finger tab is integral with the insulating mantle.

3. A jumper connector for making an electric connection between male contacts that protrude from a printed circuit board, the jumper connector having at least one finger tab and being a length severed from an extruded continuous body of a double-part structure that is composed of: an elongate core formed of a conductive elastomer and having a plurality of parallel bores which are to be forcibly fitted on male contacts; and an elongate insulating mantle made of a nonconductive elastomer and covering the outer periphery of the elongate core, wherein the elongate insulating mantle comprises a longitudinal ridge-shaped lug, whereby the finger tab extending along a side of the insulating mantle is formed by the severing of the extruded continuous body and whereby the finger tab is usable to press the connector onto the male contacts or pull the connector away from the male contacts.

4. A jumper connector for making an electric connection between male contacts that protrude from a printed circuit board, the jumper connector comprising:

a recipient core made of a conductive elastomer;

parallel bores formed through the recipient core so as to be tightly fitted on the male contacts;

an insulating mantle integrally secured to and covering an outer peripheral surface of the recipient core;

at least one finger tab extending longitudinally from the insulating mantle and usable for pressing the connector towards the male contacts or pulling the connector away from the male contacts; and a guide means formed in or on the bottom of the recipient core so as to facilitate the male contacts to take a correct position aligned with the parallel bores.

5. A jumper connector as defined in claim 4, wherein the guide means consists of a first groove and second grooves each intersecting it, and the first groove extends straight across the bottom openings of the core's parallel bores, with each of the second grooves extending across one of said bottom openings.

6. A jumper connector as defined in claim 4, wherein the guide means consists of at least one boss protruding downward from the bottom of the recipient core, and each boss is located adjacent to the openings of the parallel bores.

* * * * *